United States Patent
Bloodworth et al.

(12)

(10) Patent No.: US 6,445,242 B2
(45) Date of Patent: *Sep. 3, 2002

(54) FUSE SELECTABLE PINOUT PACKAGE

(75) Inventors: Bryan E. Bloodworth, Irving; Paul M. Emerson, Murphy; Glenn C. Mayfield; Echere Iroaga, both of Garland, all of TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/447,503

(22) Filed: Nov. 23, 1999

(51) Int. Cl.⁷ .............................................. H01H 37/76
(52) U.S. Cl. ...................................................... 327/525
(58) Field of Search ................................ 327/524, 525, 327/564, 565; 438/467; 326/39, 41, 47

(56) References Cited

U.S. PATENT DOCUMENTS

| 4,595,945 | A | | 6/1986 | Graver ........................ 357/70 |
| 4,609,241 | A | | 9/1986 | Peterson ................. 339/170 F |
| 4,642,620 | A | | 2/1987 | Togashi et al. ............. 340/713 |
| 4,772,936 | A | | 9/1988 | Reding et al. ................ 357/80 |
| 4,866,508 | A | * | 9/1989 | Eichelberger et al. ........ 357/74 |
| 5,066,831 | A | * | 11/1991 | Spielberger et al. ....... 174/52.4 |
| 5,168,177 | A | * | 12/1992 | Shankar et al. ................ 326/27 |
| 5,442,170 | A | * | 8/1995 | Kreft et al. .................. 250/229 |
| 5,459,453 | A | * | 10/1995 | Minerd et al. .............. 340/825 |
| 5,703,402 | A | | 12/1997 | Chu et al. .................... 257/737 |
| 5,705,938 | A | * | 1/1998 | Kean ............................ 326/39 |
| 5,789,939 | A | * | 8/1998 | Agrawal et al. .............. 326/41 |
| 5,808,351 | A | * | 9/1998 | Nathan et al. .............. 257/528 |
| 5,819,050 | A | * | 10/1998 | Boehling et al. ........... 395/284 |
| 5,861,667 | A | | 1/1999 | Kuwano ..................... 257/691 |

* cited by examiner

Primary Examiner—Timothy P. Callahan
Assistant Examiner—Hai L. Nguyen
(74) Attorney, Agent, or Firm—W. Daniel Swayze, Jr.; W. James Brady; Frederick J. Telecky

(57) ABSTRACT

An integrated circuit having a pinout configuration, having a first configuration of pins and a circuit to change the integrated circuit to a second configuration of pins.

3 Claims, 2 Drawing Sheets

FUSE SELECTABLE PINOUT PACKAGE

FIELD OF THE INVENTION

The present invention relates generally to electrical connectors and methods, and more particularly to an integrated circuit socket and method for altering the effective pinout arrangement and/or connections of an integrated circuit.

BACKGROUND OF THE INVENTION

In the modern electronic industry, integrated circuits and similar mechanically configured devices frequently are used. Such devices may, for example, be a microprocessor, a read only memory (ROM), a random access memory (RAM), logic arrays, integrated logic circuits, switches, hard disk drive (HDD), etc. Such devices are usually mechanically configured to have a three-dimensional rectangular package within which the active or passive circuitry components, switches, etc., are contained and a plurality of electrical leads extending outwardly from the package to provide electrical connections for the respective circuits within the package to circuitry external to the package. For convenience of description, each of such devices will be referred to hereinafter as an integrated circuit (IC) device; however, such label is intended to include the previously listed devices and other types of devices that are contained in a packaged configuration. Moreover, such electrical leads sometimes are referred to as terminals, contacts, pins, etc., and for convenience of the following description, the same will be referred to as pins.

Electronic circuitry is usually designed for use with a particular integrated circuit, such as a specific microprocessor manufactured by a specific manufacturer or a specific circuitry such as a preamp for a HDD and having a specific pinout pattern or configuration. These pins are numbered for sake of identification. For example, pin number 1 of the integrated circuit package may be intended to connect to a voltage source, pin number 2 may be an interrupt input for the microprocessor, pin number 3 may be a ground connection, etc. The layout and interconnections of printed circuit traces on a printed circuit board to connect to the IC intended to use a specific microprocessor usually are designed for use with a particular microprocessor of a particular manufacturer.

In addition, such integrated circuits are used in conjunction with magnetic disk drives. These magnetic disk drives have read/write heads which are used for both writing data to a magnetic disk and reading data from the magnetic disk. During a write operation, a write signal is provided to a selected read/write head from a write control circuit. The write signal represents data to be encoded onto the magnetic disk. More particularly, the read/write head receives encoded digital data from a "channel" chip. The transitions of the signal received from the channel chip cause the write current flowing within the read/write head to reverse direction, which in turn induces a flux reversal in the magnetized material of the medium. During a read operation, the read/write head senses flux reversals from the magnetic disk and amplifies the signal for the channel by a preamplifier. The flux reversals are encoded onto the magnetic disk during the write operation. Based on the flux reversals, the read/write head provides a read signal to a read channel. The read circuit amplifies the read signal, and the channel circuit recovers the data. The read circuit then provides the data to a magnetic disk controller for further processing.

Each magnetic disk in the disk drive has a corresponding "head" adjacent to the top and bottom surfaces of the disk. Thus, there are two N heads per stack where N equals the number of disks in the drive. Normally, only one head is active at any time. Thus, for each head, there may be a plurality of connectors for either providing a read or write function. For example, one head may require four connections, namely a ground wire, a read wire, and a pair of write wires.

In U.S. Pat. No. 4,609,241 a socket where the IC is placed can be readily programmed to adapt the pinout configuration of the integrated circuit device for convenient plug-in use for substitution in an environment such as the socket. However, such a device leaves the pinout configuration of the integrated circuit unchanged.

These heads require at least two current paths so that current can flow in two directions in the head. Thus, a 0 or 1 can be written on the magnetic disk. To write current in one direction, two terminals are required, and thus, for each head, four terminals are required for current to flow in two directions. It is possible to reduce the number of connections for the pins by using a common ground connection. Conventional ICs are limited by having a fixed pinout configuration. A fixed pin configuration is not desirable. Different manufacturers require the same functions in an IC, but different pinout configuration results in a multitude of parts having to be produced in order to satisfy manufacturer pinout configurations.

SUMMARY OF THE INVENTION

In accordance with the present invention, a programmable IC is described to change the pinout configuration from a first pinout configuration to a second pinout configuration. Thus, the same integrated circuit can be used for different manufacturers having different pinout configurations.

DETAILED DESCRIPTION OF THE PRESENT INVENTION

Figure 1:
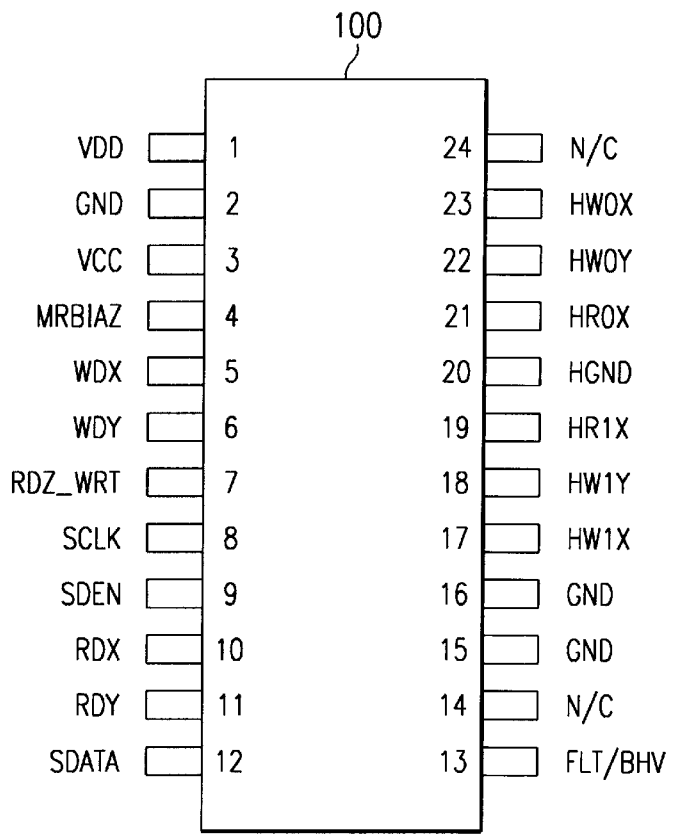
FIG. 1 illustrates a pinout configuration for a two-channel device.
Figure 2:
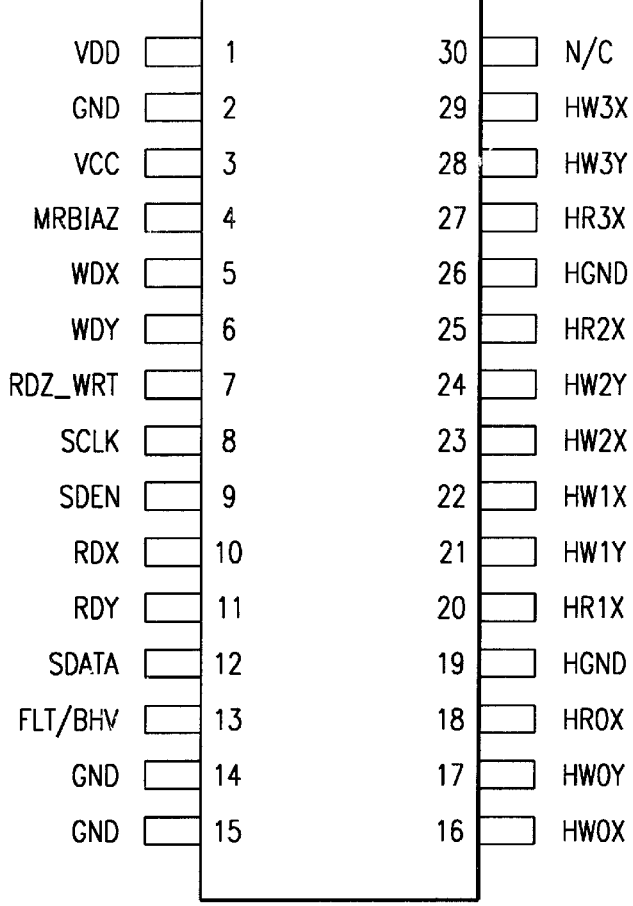
FIG. 2 illustrates a first pinout configuration for a four-channel device.
Figure 3:
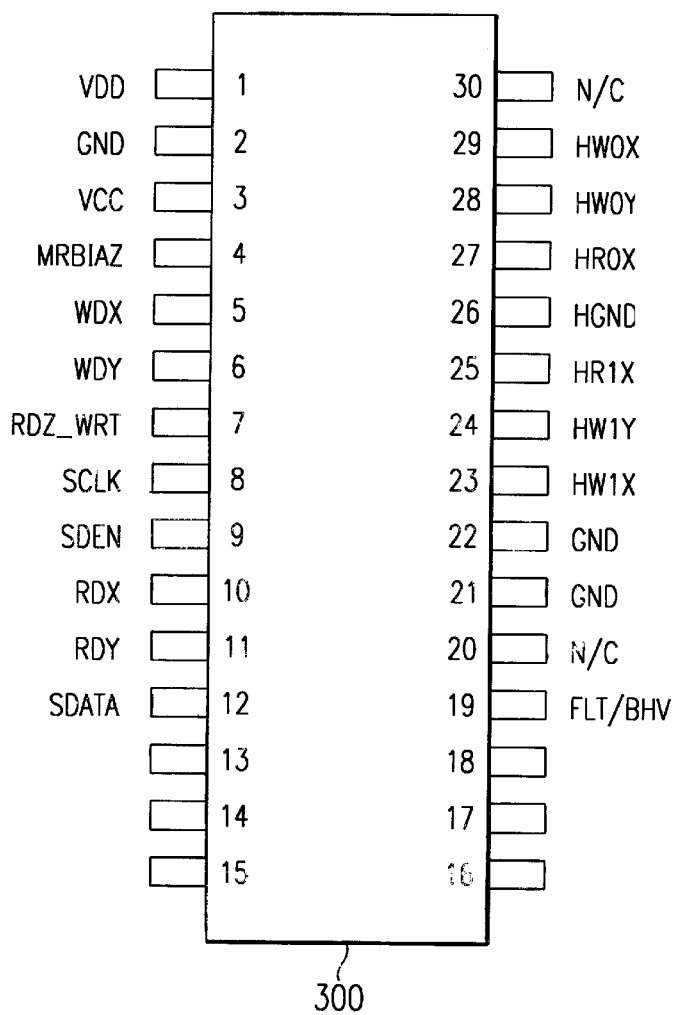
FIG. 3 illustrates a second pinout configuration for the same IC as FIG. 2 with a pinout configuration for a two-channel device.

A description of various pins found in FIGS. 1, 2 and 3 follows. $V_{DD}$ is the pin for the 8-volt power supply, and $V_{CC}$ is the pin for the 5-volt power supply. The GND is the ground. The HGND pin is the MR head connection, negative end. The RnX is the MR head connection, positive end, for both input and output. RDX and RDY is the differential read data output. WDX and WDY pin is the write data input, PECL. The pin WnX and WnY is the inductive write head connection. The FLT/BHV is a multiplexer pin for a fault output or BHV. In the fault mode, (MRM=0) (ABHV=0), an open collector output is shown. Read mode, a low indicates abnormal read condition. In the write mode, a high indicates abnormal write condition. In the MR measure mode, the DBHV comparator output (MRM=1) (ABHV=0), an open collector output; a high indicates the head voltage is lower than the set threshold, and a low indicates the head voltage is higher than the set threshold. In ABHV mode (MRM=1)

(ABHV=1), pin is an analog output. RDZ_WRT, read/write 2.5/3.3 V logic with internal pull-down. Write fis active high. MRBIASZ pin, the MR bias current is on, 2.5/3.3 V logic with internal pull-up. Bias current active at low. The SDEN pin is a serial port enable 2.5/3.3 V logic.

The SDATA pin is a serial data open collector output (5 mA current sink). The SCLK is a serial clock 2.5/3.3 V logic.

FIG. 1 illustrates a two-channel preamp IC 100. The left side of integrated circuit 100 includes the pins necessary for the integrated circuit 100 itself while the right side includes pin connections for the read/write head. For example, at the top right at pin 23 is the HWOX pin, pin 22 the HWOY pin, pin 21 the HROX pin, pin 20 the HGND pin, pin 19 the HRIX pin, pin 18 the HWIY pin, pin 17 the HWIX pin, pin 16 ground, pin 15 ground, and pin 13 the FLT/BHV pin.

FIG. 2 illustrates a four-channel integrated circuit 200 in a first pin configuration. The left side of integrated circuit 200 shows the connections for head 3 at pins 29, 28 and 27, and the pins for head 0 at pins 16, 17 and 18. In FIG. 3, which illustrates the same integrated circuit 300 as FIG. 2 in a second configuration, the bottom three pins on both the left and right sides have been inactivated on integrated circuit 300. Namely, pins 13, 14, and 15 on the left side of integrated circuit 300 have been inactivated, and pins 18, 17 and 16 on the right side of integrated circuit 300 have been inactivated. On the left side of integrated circuit 300, the connection for head 0 is illustrated. More particularly, pin 29, pin 28 and pin 27 are for head 0. Thus, the pins 29, 28 and 27 have been switched from connection of head 3 in FIG. 2 on integrated circuit 200 to connection to head 0 on integrated circuit 300 as illustrated in FIG. 3. Thus, the integrated circuit 300 in FIG. 3 has the same pin configuration, albeit some inactive pins, as integrated circuit 100 as illustrated in FIG. 1. Consequently, the pin configuration of the same integrated circuit can be changed to meet a different design or to meet the requirements of different manufacturers. The configuration is changed from a first pin configuration to a second pin configuration.

Figure 4:
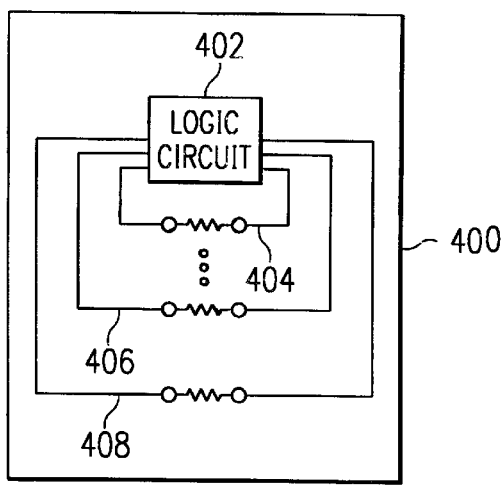
FIG. 4 illustrates the IC and logic circuits.
Figure 5:
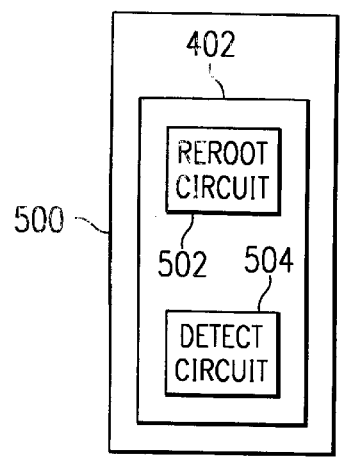
FIG. 5 illustrates a detailed circuit diagram of the logic circuit.

How this pin configuration is accomplished is discussed next. In FIG. 4, fuses 404, 406 and 408 are illustrated as a portion of integrated circuit 400. Logic circuit 402 reads the terminals between fuses 404, 406 and 408 to determine a binary code from these fuses. Different binary codes can be achieved from the fuses 404, 406 and 408 by blowing either one or a select few or all of fuses 404, 406 and 408. Thus, each different state (blown or unblown) of pins 404, 406 and 408 could represent a different pin configuration for integrated circuit 400. Logic circuit 402 reads this fuse circuit, and the detect circuit 504, as illustrated in FIG. 5, instructs the reroute circuit 502 to reroute, through internal traces of the integrated circuit, the various circuits necessary to perform the function as required to achieve the new or second pin configuration. Thus, a gain in bandwidth or backsetting can be achieved, and it is possible to sell the same die to either a first manufacturer or a second manufacturer where each of the different manufacturers require a different pin configuration.

What is claimed is:

1. An integrated circuit having at least two pin configurations, comprising:
    said integrated circuit having a first circuit for connection to a first disk drive head and for connection to a second disk drive head;
    wherein said integrated circuit has a first pin configuration corresponding to a function for connection of said first circuit to said first disk drive head and a circuit to change said integrated circuit to a second pin configuration corresponding to said function for connection of said first circuit to said second disk drive head from said first pin configuration.

2. An integrated circuit as in claim 1, wherein said circuit is programmable to select said second configuration from a plurality of configurations.

3. An integrated circuit as in claim 1, wherein said circuit includes fuses to determine said second configuration.

* * * * *